US007739062B2

(12) United States Patent
Wang

(10) Patent No.: US 7,739,062 B2
(45) Date of Patent: Jun. 15, 2010

(54) METHOD OF CHARACTERIZING THE OVERLAP OF TWO MEDIA SEGMENTS

(75) Inventor: Avery Li-Chun Wang, Palo Alto, CA (US)

(73) Assignee: Landmark Digital Services LLC, Nashville, TN (US)

( * ) Notice: Subject to any disclaimer, the term of this patent is extended or adjusted under 35 U.S.C. 154(b) by 493 days.

(21) Appl. No.: 11/629,393

(22) PCT Filed: Jun. 24, 2005

(86) PCT No.: PCT/US2005/022331

§ 371 (c)(1), (2), (4) Date: Jan. 22, 2007

(87) PCT Pub. No.: WO2006/012241

PCT Pub. Date: Feb. 2, 2006

(65) Prior Publication Data

US 2008/0091366 A1 Apr. 17, 2008

Related U.S. Application Data

(60) Provisional application No. 60/582,498, filed on Jun. 24, 2004.

(51) Int. Cl.
*G01R 13/00* (2006.01)

(52) U.S. Cl. ........................ 702/71; 702/75; 704/270.1; 704/231; 704/200; 704/273

(58) Field of Classification Search ................... 702/71, 702/75, 76; 704/270.1, 231, 200, 273
See application file for complete search history.

(56) References Cited

U.S. PATENT DOCUMENTS

| | | | | |
|---|---|---|---|---|
| 4,415,767 | A | 11/1983 | Gill et al. | |
| 4,450,531 | A | 5/1984 | Kenyon et al. | |
| 4,843,562 | A | 6/1989 | Kenyon et al. | |
| 5,210,820 | A | 5/1993 | Kenyon | |
| 7,174,293 | B2 | 2/2007 | Kenyon et al. | |
| 7,194,752 | B1 | 3/2007 | Kenyon et al. | |
| 2002/0082837 | A1* | 6/2002 | Pitman et al. | 704/270.1 |
| 2002/0083060 | A1* | 6/2002 | Wang et al. | 707/10 |
| 2006/0277047 | A1* | 12/2006 | DeBusk et al. | 704/273 |

FOREIGN PATENT DOCUMENTS

| | | |
|---|---|---|
| WO | WO 01/04870 | 1/2001 |
| WO | WO-02/11123 | 2/2002 |

OTHER PUBLICATIONS

English Translation of Office Action from Chinese Application: 2005-80020582.9 dated Feb. 22, 2008, 6 pgs.

* cited by examiner

*Primary Examiner*—Drew A Dunn
*Assistant Examiner*—Hien X Vo
(74) *Attorney, Agent, or Firm*—Woodcock Washburn LLP

(57) ABSTRACT

A method of characterizing the overlap of two media segments is provided. In an instance where there is some amount of overlap of a file and a data sample, the file could be an excerpt of an original file and begin and end within the data sample. By matching identified features of the file with identified features of the data sample, a beginning and ending time of a portion of the file that is within the data sample can be determined. Using these times, a length of the file within the data sample can also be determined.

28 Claims, 5 Drawing Sheets

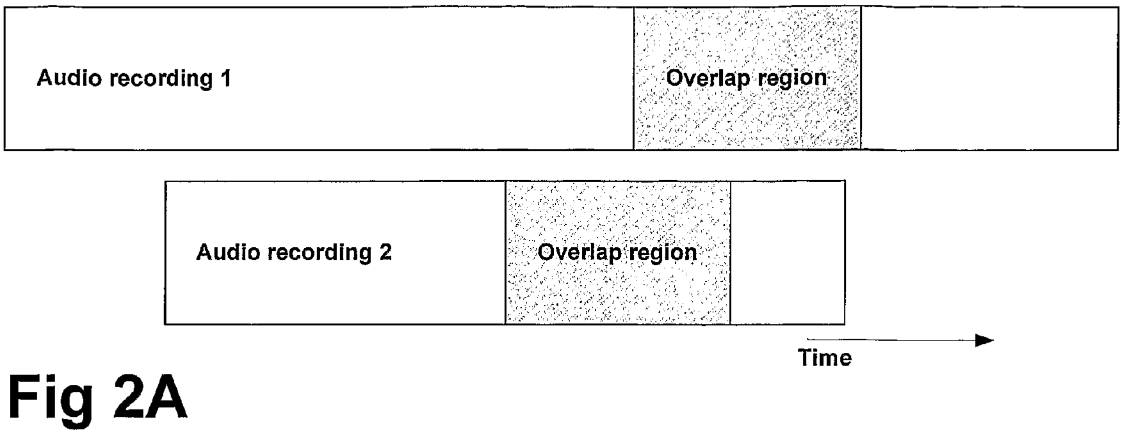
Fig 2A
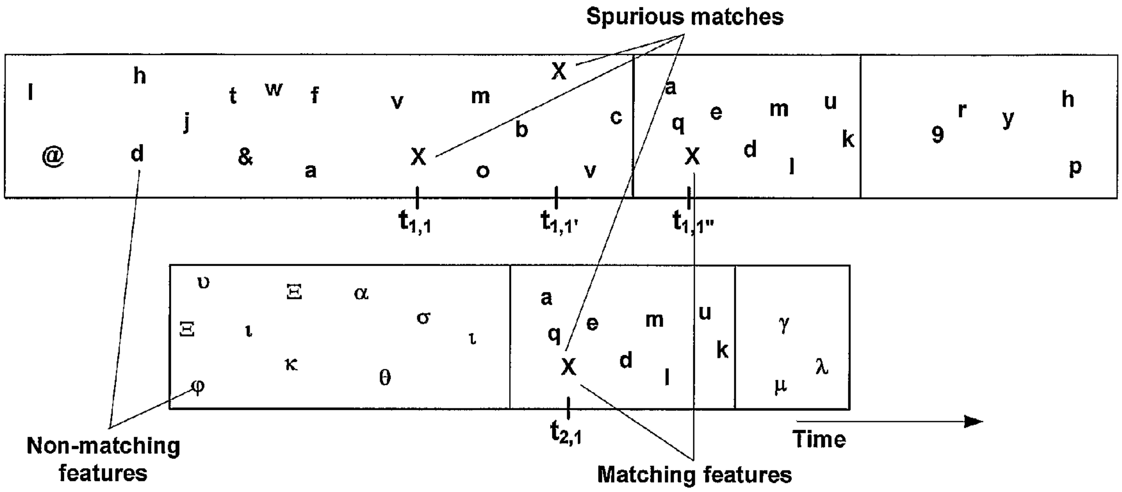
Fig 2B
$(t_{1,1},t_{2,1})$ : X
$(t_{1,1'},t_{2,1})$ : X
$(t_{1,1''},t_{2,1})$ : X
$(t_{1,2},t_{2,2})$ : a
$(t_{1,3},t_{2,3})$ : q
$(t_{1,4},t_{2,4})$ : e
$(t_{1,5},t_{2,5})$ : d
$(t_{1,6},t_{2,6})$ : m
$(t_{1,7},t_{2,7})$ : l
$(t_{1,8},t_{2,8})$ : u
$(t_{1,9},t_{2,9})$ : k
Fig 2C

METHOD OF CHARACTERIZING THE OVERLAP OF TWO MEDIA SEGMENTS

CROSS-REFERENCE TO RELATED APPLICATIONS

The present patent application claims priority under 35 U.S.C. §119(e) to U.S. Provisional Patent Application Ser. No. 60/582,498, filed on Jun. 24, 2004, the entirety of which is herein incorporated by reference.

FIELD OF INVENTION

The present invention generally relates to identifying content within broadcasts, and more particularly, to identifying information about segments or excerpts of content within a data stream.

BACKGROUND

Today's digital media have opened the door to an information marketplace where although it enables a greater degree of flexibility in digital content distribution and possibly at a lower cost, the commerce of digital information raises potential copyright issues. Such issues can become increasingly important due to the highly increasing amount of audio distribution channels, including radio stations, Internet radio, file download and exchange facilities, and also due to new audio technologies and compression algorithms, such as MP3 encoding and various streaming audio formats. Further, with tools to "rip" or digitize music from a compact disc so readily available, the ease of content copying and distribution has made it increasingly difficult for content owners, artists, labels, publishers and distributors, to maintain control of and be compensated for their copyrighted properties. For example, for content owners, it is important to know where their digital content (e.g., music) is played, and consequently, if royalties are due to them.

Accordingly, in the field of audio content identification, it is desirable to know, in addition to an identity of audio content, precisely how long an excerpt of an audio recording is, as embedded within another audio recording that is being broadcast. For example, performing rights organizations (PRO) collect performing rights royalties on behalf of their members, composers and music publishers when licensable recordings are played on the radio, television, and movies, and the amount of the royalties is typically based upon an actual length of the recording played. The PRO may then distribute these royalties to its members, minus the PRO's administration costs.

The music industry is exploring methods to manage and monetize the distribution of music. Some solutions today rely on a file name for organizing content, but because there is no file-naming standard and file names can be so easily edited, this approach may not work very well. Another solution may be the ability to identify audio content by examining properties of the audio, whether it is stored, downloadable, streamed or broadcast, and to identify other aspects of the audio broadcast.

SUMMARY

Within embodiments disclosed herein, a method of identifying common content between a first recording and a second recording is provided. The method includes determining a first set of content features from the first recording and a second set of content features from the second recording. Each feature in the first and second set of content features occurs at a corresponding time offset in the respective recording. The method further includes identifying matching pairs of features between the first set of content features and the second set of content features, and within all of the matching pairs of features, identifying an earliest time offset corresponding to a feature in a given matching pair.

Within another aspect, the exemplary embodiment includes receiving a first recording that includes at least a portion of a second recording, and determining a length of the portion of the second recording contained within the first recording. The method also includes determining which portion of the second recording is included within the first recording.

Within still another aspect, the exemplary embodiment includes determining a first set of content features from a first recording and determining a second set of content features from a second recording. Each feature in the first and second sets of content features occurs at a corresponding time offset in their respective recordings. The method also includes identifying features from the second set of content features that are in the first set of content features, and from the identified features, identifying a set of time-pairs. A time-pair includes a time offset in the first recording associated with a feature from the first recording and a time offset in the second recording associated with a feature from the second recording that matches the feature from the first recording. The method further includes identifying time-pairs within the set of time-pairs having a linear relationship.

These as well as other features, advantages and alternatives will become apparent to those of ordinary skill in the art by reading the following detailed description, with appropriate reference to the accompanying drawings.

BRIEF DESCRIPTION OF FIGURES

FIG. 2A illustrates two example audio recordings with a common overlap region in time.

FIG. 2B illustrates example schematic feature analyses for the audio recordings of FIG. 2A with the horizontal axis representing time and the symbols representing features at landmark time offsets within the recordings.

FIG. 2C illustrates an example support list of matching time-pairs associated with matching feature symbols within the two audio recordings.

DETAILED DESCRIPTION

Within exemplary embodiments described below, a method for identifying content within data streams is provided. The method may be applied to any type of data content identification. In the following examples, the data is an audio data stream. The audio data stream may be a real-time data stream or an audio recording, for example.

In particular, the methods disclosed below describe techniques for identifying an audio file within some data content, such as another audio sample. In such an instance, there will likely be some amount of overlap of common content of the file and the sample (i.e., the file will be played over the sample), and the file could begin and end within the audio sample as an excerpt of the original file. Thus, it is desirable to determine with a reasonable accuracy the times at which the beginning and ending of the file are within the audio sample for royalty collection issues, for example, which may depend on a length of the audio file that is used. For example, specifically, if a ten second television commercial contains a five second portion of a song that is three minutes long, it is desirable to detect that the commercial contains an excerpt or snippet of the song and also to determine the length and portion of the song used in order to determine royalty rights of the portion used.

Figure 1:
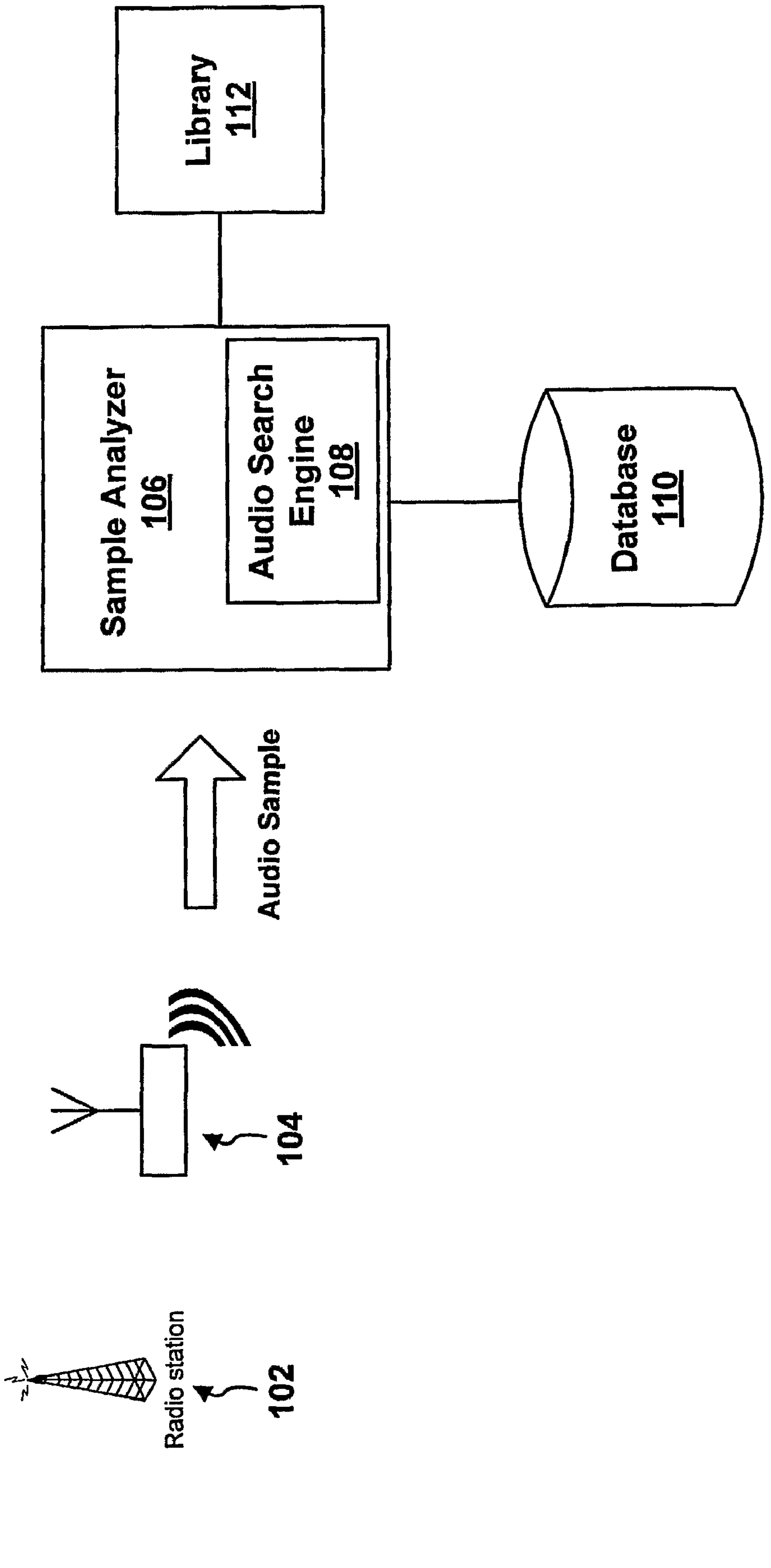
FIG. 1 illustrates one example of a system for identifying content within an audio stream.

Referring now to the figures, FIG. 1 illustrates one example of a system for identifying content within other data content, such as identifying a song within a radio broadcast. The system includes radio stations, such as radio station 102, which may be a radio or television content provider, for example, that broadcasts audio streams and other information to a receiver 104. A sample analyzer 106 will monitor the audio streams received and identify information pertaining to the streams, such as track identities. The sample analyzer 106 includes an audio search engine 108 and may access a database 110 containing audio sample and broadcast information, for example, to identify tracks within a received audio stream. Once tracks within the audio stream have been identified, the track identities may be reported to a library 112, which may be a consumer tracking agency, or other statistical center, for example.

The database 110 may include many recordings and each recording has a unique identifier, e.g., sound_ID. The database itself does not necessarily need to store the audio files for each recording, since the sound_IDs can be used to retrieve the audio files from elsewhere. The sound database index is expected to be very large, containing indices for millions or even billions of files, for example. New recordings are preferably added incrementally to the database index.

While FIG. 1 illustrates a system that has a given configuration, the components within the system may be arranged in other manners. For example, the audio search engine 108 may be separate from the sample analyzer 106. Thus, it should be understood that the configurations described herein are merely exemplary in nature, and many alternative configurations might also be used.

The system in FIG. 1, and in particular the sample analyzer 106, may identify content within an audio stream. FIG. 2A illustrates two audio recordings with a common overlap region in time, each of which may be analyzed by the sample analyzer 106 to identify the content. The audio recording 1 may be any type of recording, such as a radio broadcast or a television commercial. The audio recording 2 is an audio file, such as a song or other recording that may be included within the audio recording 1, or at least a portion of audio recording 2 that is included in audio recording 1, as shown by the overlap regions of the recordings. For example, the region labeled overlap within audio recording 1 represents the portion of the audio recording 2 that is included in audio recording 1, and the region labeled overlap within audio recording 2 represents the portion of audio recording 2 within audio recording 1. Overlap refers to audio recording 2 being played over a portion of audio recording 1.

Using the methods disclosed herein, the extent of an overlapping region (or embedded region) between a first and a second media segment can be identified and reported. Additionally, embedded fragments may still be identified if the embedded fragment is an imperfect copy. Such imperfections may arise from processing distortions, for example, from mixing in noise, sound effects, voiceovers, and/or other interfering sounds. For example, a first audio recording may be a performance from a library of music, and a second audio recording embedded within the first recording could be from a movie soundtrack or an advertisement, in which the first audio recording serves as background music behind a voiceover mixed in with sound effects.

In order to identify a length and portion of audio recording 2 (AR2) within audio recording 1 (AR1), initially, audio recording 1 is identified. AR1 is used to retrieve AR2, or at least a list of matching features and their corresponding times within AR2. FIG. 2B conceptually illustrates features of the audio recordings that have been identified. Within FIG. 2B, the features are represented by letters and other ASCII characters, for example. Various audio sample identification techniques are known in the art for identifying audio samples and features of audio samples using a database of audio tracks. The following patents and publications describe possible examples for audio recognition techniques, and each is entirely incorporated herein by reference, as if fully set forth in this description.

Kenyon et al, U.S. Pat. No. 4,843,562, entitled "Broadcast Information Classification System and Method"

Kenyon, U.S. Pat. No. 5,210,820, entitled "Signal Recognition System and Method"

Haitsma et al, International Publication Number WO 02/065782 A1, entitled "Generating and Matching Hashes of Multimedia Content"

Wang and Smith, International Publication Number WO 02/11123 A2, entitled "System and Methods for Recognizing Sound and Music Signals in High Noise and Distortion"

Wang and Culbert, International Publication Number WO 03/091990 A1, entitled "Robust and Invariant Audio Pattern Matching"

In particular, the system and methods of Wang and Smith may return, in addition to the metadata associated with an identified audio track, the relative time offset (RTO) of an audio sample from the beginning of the identified audio track. Additionally, the method by Wang and Culbert may return the time stretch ratio, i.e., how much an audio sample, for example, is sped up or slowed down as compared to an original audio track. Prior techniques, however, have been unable to report characteristics on the region of overlap between two audio recordings, such as the extent of overlap. Once a media segment has been identified, it is desirable to report the extent of the overlap between a sampled media segment and a corresponding identified media segment.

Briefly, identifying features of audio recordings 1 and 2 begins by receiving the signal and sampling it at a plurality of sampling points to produce a plurality of signal values. A statistical moment of the signal can be calculated using any known formulas, such as that noted in U.S. Pat. No. 5,210,820, for example. The calculated statistical moment is then compared with a plurality of stored signal identifications and the received signal is recognized as similar to one of the stored signal identifications. The calculated statistical moment can be used to create a feature vector which is quantized, and a weighted sum of the quantized feature vector is used to access a memory which stores the signal identifications.

In another example, generally, audio content can be identified by identifying or computing characteristics or fingerprints of an audio sample and comparing the fingerprints to previously identified fingerprints. The particular locations within the sample at which fingerprints are computed depend on reproducible points in the sample. Such reproducibly computable locations are referred to as "landmarks." The location within the sample of the landmarks can be determined by the sample itself, i.e., is dependent upon sample qualities and is reproducible. That is, the same landmarks are computed for the same signal each time the process is repeated. A landmarking scheme may mark about 5-10 landmarks per second of sound recording; of course, landmarking density depends on the amount of activity within the sound recording.

One landmarking technique, known as Power Norm, is to calculate the instantaneous power at many timepoints in the recording and to select local maxima. One way of doing this is to calculate the envelope by rectifying and filtering the waveform directly. Another way is to calculate the Hilbert transform (quadrature) of the signal and use the sum of the magnitudes squared of the Hilbert transform and the original signal. Other methods for calculating landmarks may also be used.

Once the landmarks have been computed, a fingerprint is computed at or near each landmark timepoint in the recording. The nearness of a feature to a landmark is defined by the fingerprinting method used. In some cases, a feature is considered near a landmark if it clearly corresponds to the landmark and not to a previous or subsequent landmark. In other cases, features correspond to multiple adjacent landmarks.

The fingerprint is generally a value or set of values that summarizes a set of features in the recording at or near the timepoint. In one embodiment, each fingerprint is a single numerical value that is a hashed function of multiple features. Other examples of fingerprints include spectral slice fingerprints, multi-slice fingerprints, LPC coefficients, cepstral coefficients, and frequency components of spectrogram peaks.

Fingerprints can be computed by any type of digital signal processing or frequency analysis of the signal. In one example, to generate spectral slice fingerprints, a frequency analysis is performed in the neighborhood of each landmark timepoint to extract the top several spectral peaks. A fingerprint value may then be the single frequency value of the strongest spectral peak.

To take advantage of time evolution of many sounds, a set of timeslices can be determined by adding a set of time offsets to a landmark timepoint. At each resulting timeslice, a spectral slice fingerprint is calculated. The resulting set of fingerprint information is then combined to form one multi-tone or multi-slice fingerprint. Each multi-slice fingerprint is more unique than the single spectral slice fingerprint, because it tracks temporal evolution, resulting in fewer false matches in a database index search.

For more information on calculating characteristics or fingerprints of audio samples, the reader is referred to U.S. Patent Application Publication US 2002/0083060, to Wang and Smith, entitled "System and Methods for Recognizing Sound and Music Signals in High Noise and Distortion," the entire disclosure of which is herein incorporated by reference as if fully set forth in this description.

Thus, the audio search engine 108 will receive audio recording 1 and compute fingerprints of the sample. The audio search engine 108 may compute the fingerprints by contacting additional recognition engines. To identify audio recording 1, the audio search engine 108 can then access the database 110 to match the fingerprints of the audio sample with fingerprints of known audio tracks by generating correspondences between equivalent fingerprints, and the file in the database 110 that has the largest number of linearly related correspondences or whose relative locations of characteristic fingerprints most closely match the relative locations of the same fingerprints of the audio sample is deemed the matching media file. That is, linear correspondences between the landmark pairs are identified, and sets are scored according to the number of pairs that are linearly related. A linear correspondence occurs when a statistically significant number of corresponding sample locations and file locations can be described with substantially the same linear equation, within an allowed tolerance. The file of the set with the highest statistically significant score, i.e., with the largest number of linearly related correspondences, is the winning file.

Using the above methods, the identity of audio recording 1 can be determined. To determine a relative time offset of the audio recording, the fingerprints of the audio sample can be compared with fingerprints of the original files to which they match. Each fingerprint occurs at a given time, so after matching fingerprints to identify the audio sample, a difference in time between a first fingerprint (of the matching fingerprint in the audio sample) and a first fingerprint of the stored original file will be a time offset of the audio sample, e.g., amount of time into a song. Thus, a relative time offset (e.g., 67 seconds into a song) at which the sample was taken can be determined.

In particular, to determine a relative time offset of an audio sample, a diagonal line with a slope near one within a scatter plot of the landmark points of a given scatter list can be found. A scatter plot may include known sound file landmarks on the horizontal axis and unknown sound sample landmarks (e.g., from the audio sample) on the vertical axis. A diagonal line of slope approximately equal to one is identified within the scatter plot, which indicates that the song which gives this slope with the unknown sample matches the sample. An intercept at the horizontal axis indicates the offset into the audio file at which the sample begins. Thus, using the "System and Methods for Recognizing Sound and Music Signals in High Noise and Distortion," disclosed by Wang and Smith, for example as discussed above, produces an accurate relative time offset between a beginning of the identified content file from the database and a beginning of the audio sample being analyzed, e.g., a user may record a ten second sample of a song that was 67 seconds into a song. Hence, a relative time offset is noted as a result of identifying the audio sample (e.g., the intercept at the horizontal axis indicates the relative time offset). Other methods for calculating the relative time offset are possible as well.

Thus, the Wang and Smith technique returns, in addition to metadata associated with an identified audio track, a relative time offset of the audio sample from a beginning of the identified audio track. As a result, a further step of verification within the identification process may be used in which spectrogram peaks may be aligned. Because the Wang and Smith technique generates a relative time offset, it is possible to temporally align the spectrogram peak records within about 10 ms in the time axis, for example. Then, the number of matching time and frequency peaks can be determined, and that is a score that can be used for comparison.

For more information on determining relative time offsets, the reader is referred to U.S. Patent Application Publication US 2002/0083060, to Wang and Smith, entitled System and Methods for Recognizing Sound and Music Signals in High Noise and Distortion, the entire disclosure of which is herein incorporated by reference as if fully set forth in this description.

Using any of the above techniques, audio recordings can be identified. Thus, after a successful content recognition of audio recording 1 (as performed by any of the methods discussed above), optionally the relative time offset (e.g., time between the beginning of the identified track and the beginning of the sample), and optionally a time stretch ratio (e.g., actual playback speed to original master speed) and a confidence level (e.g., a degree to which the system is certain to have correctly identified the audio sample) may be known. In many cases, the time stretch ratio (TSR) may be ignored or may be assumed to be 1.0 as the TSR is generally close to 1. The TSR and confidence level information may be considered for more accuracy. If the relative time offset is not known it may be determined, as described below.

Within exemplary embodiments described below, a method for identifying content within data streams (using techniques described above) is provided, as shown in FIG. 3. Initially, a file identity of audio recording 1 (as illustrated in FIG. 2*a*) and offset within the audio recording 2 are determined, or are known. For example, the identity can be determined using any method described above. The relative offset $T_r$ is a time offset from the beginning of audio recording 1 to the beginning of audio recording 2 within audio recording 1 when the matching portions in the overlap region are aligned.

After receiving this information, a complete representation of the identified file and the data stream are compared, as shown at block 130. (Since the identity of audio recording 2 is known, a representation of audio recording 2 may be retrieved from a database for comparison purposes). To compare the two audio recordings, features from the identified file and the data stream are used to search for substantially matching features. Since the relative time offsets are known, features from audio recording 1 are compared to features from a corresponding time frame within audio recording 2. In a preferred embodiment, we may use local time-frequency energy peaks from a Short Time Fourier Transform with overlapping frames as features to generate a set of coordinates within each file. These coordinates are then compared at corresponding time frames. To do so, audio recording 2 may be aligned with audio recording 1 to be in line with the portion of audio recording 2 present in audio recording 1. The coordinates (e.g., time/frequency spectral peaks) will line up at points where matching features are present in both samples. The alignment between audio recording 1 and audio recording 2 may be direct if the relative time offset $T_r$ is known. In that case, matching pairs of peaks may be found by using the time/frequency peaks of one recording as a template for the other recording. If a spectral peak in one file is within a frequency tolerance of a peak from the other recording and the corresponding time offsets are within a time tolerance of the relative time offset $T_r$ from each other then the two peaks are counted as an aligned matching feature.

Other features besides time and frequency peaks may be used, for example, features as explained in Wang and Smith or Wang and Culbert (e.g., spectral time slice or linked spectral peaks).

Alternatively, in the case that the relative time offset is not available, corresponding time offsets for the identified recording and the data stream may be noted at points where matching features are noted, as shown at block 132. Within these time-offsets, aligned matches are identified resulting in a support list that contains a certain density of corresponding time offset points where there is overlapping audio with similar features. A higher density of matching points may result in a greater certainty that the identified matching points are correct.

Next, the time extent of overlap between the identified file and the data stream may be determined by determining a first and last time point within the corresponding time offsets (of the overlap region), as shown at block 134. In addition to having matching features and sufficiently dense support regions, the features between the identified file and the data stream should occur at similar relative time offsets. That is, a set of corresponding time offsets that match should have a linear relationship. Thus, the corresponding time offsets can conceptually be plotted to identify linear relationships, as shown block 136 and in FIG. 4. Time-pairs that are outside of a predetermined tolerance of a regression line can be considered to result from spurious incorrect feature matches.

Figure 3:
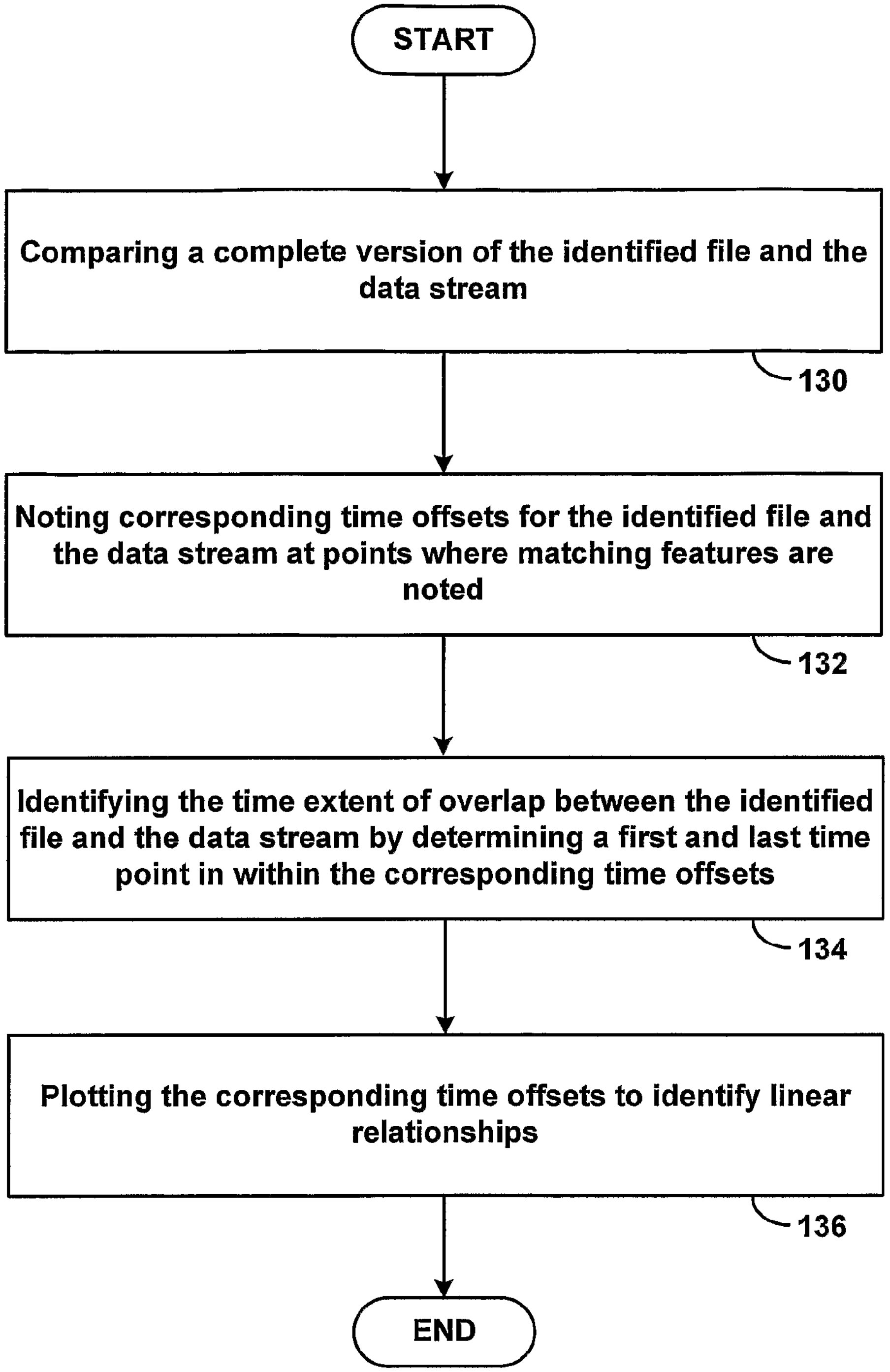
FIG. 3 illustrates an example scatter plot of the support list time-pairs of FIG. 2C with correct and incorrect matches.

In particular, according to the method described in FIG. 3, to determine the times at which the beginning and ending of the portion of audio recording 2 occurring within audio recording 1, the two recordings are compared. Each feature from the first audio recording is used to search in the second audio recording for substantially matching features. (Features of the audio recordings may be generated using any of the landmarking or fingerprinting techniques described above). Those skilled in the art may apply numerous known comparative techniques to test for similarity. In one embodiment, two features are deemed substantially similar if their values (vector or scalar) are within a predetermined tolerance, for example.

Alternatively, to compare the two audio tracks or audio files, a comparative metric may be generated. For example, for each matching pair of features from the two audio recordings, corresponding time offsets for the features from each file may be noted by putting the time offsets into corresponding "support lists" (i.e., for audio recordings 1 and 2, there would be support lists 1 and 2 respectively containing corresponding time offsets $t_{1,k}$ and $t_{2,k}$, where $t_{1,k}$ and $t_{2,k}$ are the time offsets of the $k^{th}$ matching feature from the beginning of the first and second recordings, respectively).

Still further, the support lists may be represented as a single support list containing pairs $(t_{1,k}, t_{2,k})$ of matching times. This is illustrated in FIG. 2C. In the example in FIG. 2B, there are three common features for "X" between the two files and one common feature for the remaining features within the overlap region. Thus, two of the common features for "X" are spurious matches, as shown, and only one is a matching feature. All other features in the overlap region are considered matching features. The support list indicates the time at which the corresponding feature occurs in audio recording 1, $t_{1,k}$, and the time at which the corresponding matching or spurious matching feature occurs in audio recording 2, $t_{2,k}$.

Furthermore, additional details about the matching pairs of features may be attached to the times in the support lists. The support list could then contain a certain density of corresponding time offset points where there is overlapping audio with similar features. These time points characterize the overlap between the two audio files. For example, the time extent of overlap may be determined by determining a first and a last time point within a set of time-pairs (or within the support list). Specifically, one way is to look at the earliest offset time point, $T_{earliest}$, and the latest offset time point, $T_{latest}$, from the support list for the first or second recording and subtracting to find the length of the time interval, as shown below:

$$T_{j,length}=T_{j,latest}-T_{j,earliest},$$

where j is 1 or 2, corresponding to the first or second recording, and $T_{j,length}$ is the time extent of overlap. Also, rather than actually compiling an explicit list of time offsets and then determining the maximum and minimum times, it may suffice to note the maximum and minimum time offsets of matching features, as the matching features and their corresponding time offsets are found. In either case, $T_{j,latest}=\max_k\{t_{j,k}\}$ and $T_{j,earliest}=\min_k\{t_{j,k}\}$, where $t_{j,k}$ are time offsets corresponding between files, or time points within time-pairs in the support list.

There are other characteristics that may be determined from the support list as well. For example, a density of time offset points may indicate a quality of the identification of overlap. If the density of points is very low, the estimate of the extent of overlap may have low confidence. This may be indicative of the presence of noise in one audio recording, or a spurious feature match between the two recordings, for example.

Figure 4:
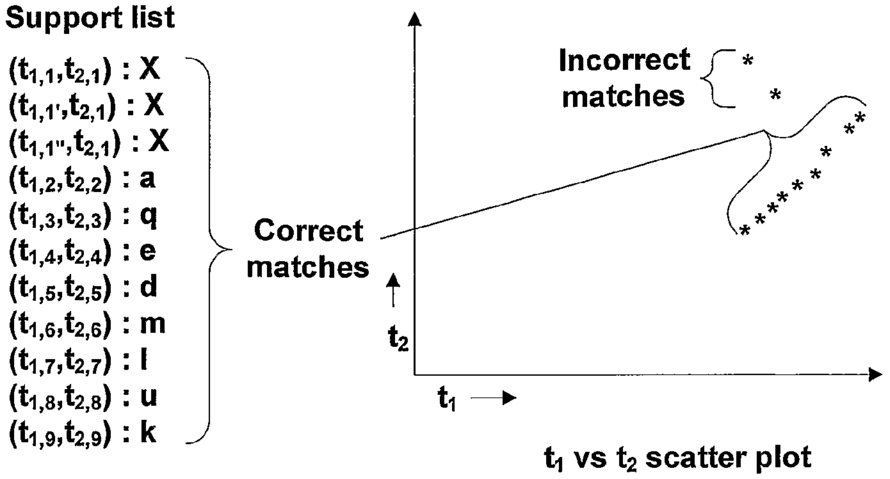
FIG. 4 illustrates an example selection of earliest and latest times for corresponding overlap regions in each audio recording.

FIG. 4 illustrates an example scatter plot of the support list time-pairs of FIG. 2C with correct and incorrect matches. In order to reduce the effect of spurious matches in case of coincidental incorrect matches between the set's features, density of time points at various positions along the time axis can be calculated or determined. If there is a low density of matching points around a certain time offset into a recording, the robustness of the match may be questioned. For example, as shown in the plot in FIG. 4, the two incorrect matches are not within the same general area as the rest of the plotted points.

Another way to calculate a density is to consider a convolution of the set of time offset values with a support kernel, for example, with a rectangular or triangular shape. Convolutions are well-known in the art of Digital Signal Processing, for example, as in Discrete-Time Signal Processing (2nd Edition) by Alan V. Oppenheim, Ronald W. Schafer, John R. Buck, Publisher: Prentice Hall; 2nd edition (Feb. 15, 1999) ISBN: 0137549202, which is entirely incorporated by reference herein. If a convolution kernel is a rectangular shape, one way to calculate the density at any given point is to observe the number of time points present within a span of a predetermined time interval $T_d$ around a desired point. To determine if a time point t is in a sufficiently dense region or neighborhood, the support list can be searched for the number of points in the interval $[t-T_d, t+T_d]$ surrounding time point t. Time points that have a density below a predetermined threshold (or number of points) may be considered to be insufficiently supported by its neighbors to be significant, and may then be discarded from the support list. Other known techniques for calculating the density may alternatively be used.

Figure 5:
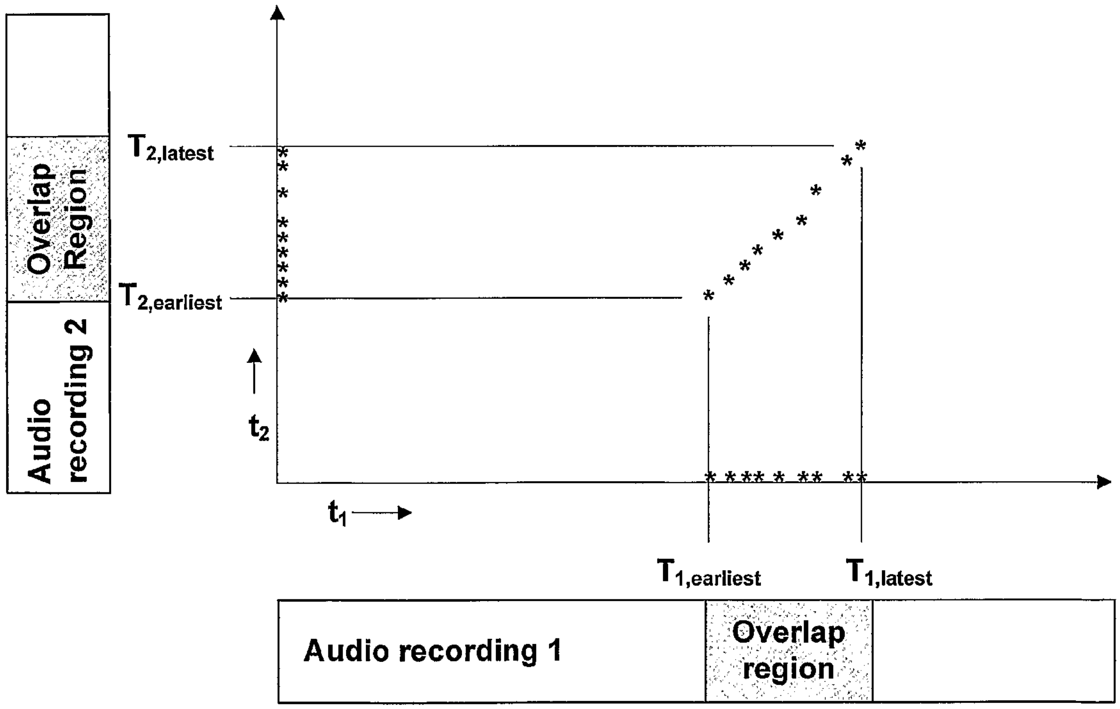
FIG. 5 illustrates example raw and compensated estimates of the earliest and latest times along the support list for one audio recording.

FIG. 5 illustrates an example selection of earliest and latest times for corresponding overlap regions in each audio recording, as shown in FIG. 4. Because the measure of starting and ending points is only an estimate based on a location of matching features, the estimate of the start and end times may be made more accurate, in one embodiment, by extrapolating a density compensation factor to the region bounded by the earliest and latest times in the support list. For example, assuming that on average a feature density is d time points per unit time interval when describing a valid overlapping region, the average time interval between feature points is then 1/d. To take into account an edge effect (e.g., content near or at the beginning or end of the portion of audio recording 2 used within audio recording 1), an interval of support can be estimated around each time point to be [−1/2d, +1/2d]. In particular, a region of support in the support interval is extended upwards and downwards by 1/2d; in other words, to the interval $[T_{earliest}-1/2d, T_{latest}+1/2d]$ having length $[T_{latest}-T_{earliest}+1/d]$. Thus, the length of audio recording 2 may be considered $[T_{earliest}-1/2d, T_{latest}+1/2d]$. This density-compensated value may be more accurate than a simple difference of the earliest and latest times in the support list. For convenience, the density may be estimated at a fixed value.

Figure 6:
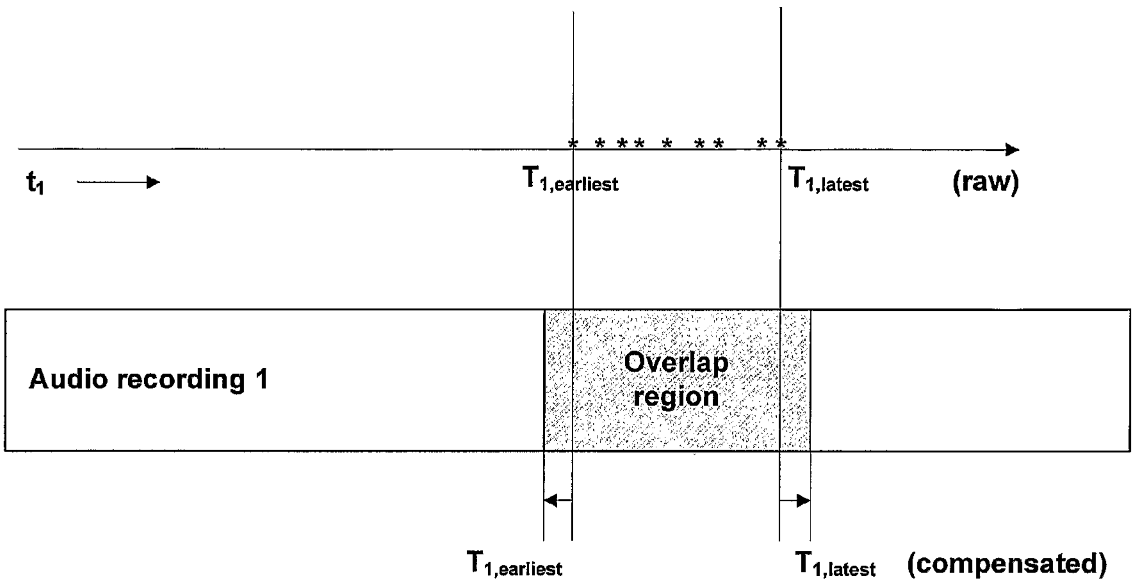
FIG. 6 is a flowchart depicting functional blocks of a method according to one embodiment.

FIG. 6 illustrates example raw and compensated estimates of the earliest and latest times along the support list for one audio recording. As shown, using the $T_{earliest}$ and $T_{latest}$ as identified in FIG. 5, the edge points of the overlap region within audio recording 1 can be identified.

In addition to having matching features and sufficiently dense support regions, the features in the support list characterizing the overlap region between two audio recordings should occur at similar relative time offsets. That is, sets of time-pairs (e.g., $(t_{1,k}, t_{2,k})$, etc.) that belong together (or match) should have a linear relationship. If the slope of the relationship is m then there is a relative offset $T_r$ such that $(t_{1,k}=T_r+m\ t_{2,k})$ should be a constant for all k. The relative time offset $T_r$ may already be known as a given parameter, or may be unknown and to be determined as follows. Ways of calculating regression parameters $T_r$ and m are well-known in the art, for example, as in "Numerical Recipes in C: The Art of Scientific Computing," by William H. Press, Brian P. Flannery, Saul A. Teukolsky, William T. Vetterling; Cambridge University Press; 2nd edition (Jan. 1, 1993), which is herein incorporated by reference. Other known temporal regression techniques may alternatively be used. The slope m of the regression line compensates for the difference in relative playback speed between the two recordings.

A regression line is illustrated in FIGS. 4 and 5. For correct feature matches, the plotted points have a linear relationship with a slope m that can be determined. Time-pairs that are outside of a predetermined tolerance of the regression line can be considered to result from spurious incorrect feature matches, as shown in FIG. 4.

Following from $(t_{1,k}=T_r+m\ t_{2,k})$, the regression line is represented by the plotted points:

$$T_r=t_{1,k}-mt_{2,k}$$

And thus, another way to eliminate spurious time-pairs is by calculating:

$$\Delta T_k=t_{1,k}-mt_{2,k}-T_r$$

which should result to or near zero. If $|\Delta T|>\delta$, where $\delta$ is a predetermined tolerance then the time-pair $(t_{1,k}, t_{2,k})$ is deleted from the support list. In many cases, one may assume that the slope is m=1, leading to:

$$\Delta T_k=t_{1,k}-t_{2,k}-T_r$$

so that spurious time-pairs $(t_{1,k}, t_{2,k})$ will be rejected if they do not have a linear relationship with other time-pairs.

Other methods for determining regression parameters are also available. For example, Wang and Culbert (Wang and Culbert, International Publication Number WO 03/091990 A1, entitled "Robust and Invariant Audio Pattern Matching") discloses a method for determining regression parameters based on histogramming frequency or time ratios from partially invariant feature matching. For example, an offset $T_r$ may be determined by detecting a broad peak in a histogram of the values of $(t_{1,k}-t_{2,k})$, ratios $f_{2,k}/f_{1,k}$ are calculated on the frequency coordinates for landmark/feature in a broad peak, and then the ratios are placed in a histogram to find a peak in the frequency ratios. The peak value in the frequency ratio yields a slope value m for the regressor. The offset $T_r$ may then be estimated from the $(t_{1,k}-m\ t_{2,k})$ values, for example, by finding a histogram peak.

Within the scope of the claims are algebraic rearrangements and combinations of terms and intermediates that can arrive at the same end results. For example, if only the length of the time interval is desired then instead of separately calculating the earliest and latest times, the time differences may be calculated more directly. Thus, using the methods described above, a length of a data file contained within a data stream can be determined.

Many embodiments have been described as being performed, individually or in combination with other embodiments, however, any of the embodiments described above may be used together or in any combination to enhance certainty of identifying samples in the data stream. In addition, many of the embodiments may be performed using a consumer device that has a broadcast stream receiving means (such as a radio receiver), and either (1) a data transmission means for communicating with a central identification server for performing the identification step, or (2) a means for carrying out the identification step built into the consumer device itself (e.g., the audio recognition means database could be loaded onto the consumer device). Further, the consumer device may include means for updating a database to accommodate identification of new audio tracks, such as Ethernet or wireless data connection to a server, and means to request a database update. The consumer device may also further include local storage means for storing recognized segmented and labeled audio track files, and the device may have playlist selection and audio track playback means, as in a jukebox, for example.

The methods described above can be implemented in software that is used in conjunction with a general purpose or application specific processor and one or more associated memory structures. Nonetheless, other implementations utilizing additional hardware and/or firmware may alternatively be used. For example, the mechanism of the present application is capable of being distributed in the form of a computer-readable medium of instructions in a variety of forms, and that the present application applies equally regardless of the particular type of signal bearing media used to actually carry out the distribution. Examples of such computer-accessible devices include computer memory (RAM or ROM), floppy disks, and CD-ROMs, as well as transmission-type media such as digital and analog communication links.

While examples have been described in conjunction with present embodiments of the application, persons of skill in the art will appreciate that variations may be made without departure from the scope and spirit of the application. For example, although the broadcast data-stream described in the examples are often audio streams, the invention is not so limited, but rather may be applied to a wide variety of broadcast content, including video, television or other multimedia content. Further, the apparatus and methods described herein may be implemented in hardware, software, or a combination, such as a general purpose or dedicated processor running a software application through volatile or non-volatile memory. The true scope and spirit of the application is defined by the appended claims, which may be interpreted in light of the foregoing.

What is claimed is:

1. A method of identifying common content between a first data stream and a second data stream comprising providing a processor for:

determining a first set of content features from the first data stream, each feature in the first set of content features occurring at a corresponding time offset in the first data stream;

determining a second set of content features from the second data stream, each feature in the second set of content features occurring at a corresponding time offset in the second data stream;

identifying matching pairs of features between the first set of content features and the second set of content features; and identifying an overlapping region between the first data stream and the second data stream based on at least one of the identified matching pairs of features.

2. The method of claim 1, wherein the first data stream and the second data stream comprise audio streams.

3. The method of claim 1, further comprising within all of the matching pairs of features, identifying an earliest time offset corresponding to a feature in a given matching pair and identifying a latest time offset corresponding to a feature in a given matching pair.

4. The method of claim 3, wherein determining the overlapping region comprises determining a length of content from the second data stream that is present within the first data stream.

5. The method of claim 4, wherein determining the length of content from the second data stream that is present within the first data stream comprises determining a difference between the earliest time offset and the latest time offset.

6. The method of claim 1, further comprising generating a support list that includes a listing of matching time offset pairs that each corresponds to time-offsets within the first data stream and the second data stream where a matching pair of features is found.

7. The method of claim 6, further comprising obtaining a relative time offset of the second data stream within the first data stream, and wherein identifying matching pairs of features between the first set of content features and the second set of content features comprises identifying corresponding features within a predetermined tolerance and corresponding time offsets within a predetermined tolerance of the relative time offset.

8. The method of claim 6, wherein the support list characterizes an overlap region between the first data stream and the second data stream.

9. The method of claim 6, further comprising:

determining from the support list a time point density at various time offsets in the overlap region, whereby the time point density characterizes a confidence of identified matching features.

10. The method of claim 9, wherein determining from the support list the time point density at various time offsets in the overlap region comprises:

determining a number of time points present within a span of a predetermined time interval T.sub.d around a desired point t; and searching the support list for a number of points in an interval [t−T.sub.d, t+T.sub.d].

11. The method of claim 10, further comprising discarding from the support list time offsets that are in insufficiently dense neighborhoods.

12. The method of claim 11, wherein a time offset point is in a sufficiently dense neighborhood if there is at least a predetermined number of neighboring points within a predetermined time interval from a first time offset point within a matching time offset pair.

13. The method of claim 11, wherein the time offset point is in an insufficiently dense neighborhood if there is not at least a predetermined number of neighboring points within a predetermined time interval from a first time offset point within a matching time offset pair, wherein the predetermined time interval is [t−T.sub.d, t+T.sub.d].

14. The method of claim 6, further comprising:

determining an earliest time from the support list; and determining a latest time from the support list, whereby the earliest time and the latest time in the support list characterize a length of an overlap region between the first data stream and the second data stream.

15. The method of claim 14, further comprising adjusting the earliest time and the latest time for density edge effects.

16. The method of claim 15, wherein adjusting the earliest time and the latest time for density edge effects comprises:

identifying a lowest time offset and a highest time offset within the support list;

subtracting a predetermined density compensation factor from the lowest time offset;

and adding a predetermined density-compensation factor to the highest time offset.

17. The method of claim 14, further comprising determining an overlap time interval by subtracting the earliest time from the latest time.

18. The method of claim 14, wherein a feature density is d time points per unit time interval when describing a valid overlapping region between the first data stream and the second data stream, and wherein an average time interval between feature points is 1/d, the method further comprising:

estimating an interval around the earliest time from the support list and the latest time from the support list to be [T.sub.earliest−1/2d, T.sub.latest+1/2d]; and calculating a length of an overlap region between the first data stream and the second data stream to be the difference between (T.sub.earliest−1/2d) and (T.sub.latest+1/2d).

19. The method of claim 1, further comprising:

for each matching pair of features, forming an associated time-pair from the respective corresponding time offsets in the first data stream and the second data stream;

determining from the time-pairs a time-pair regression line; and discarding identified matching pairs of features that deviate substantially from the time-pair regression line.

20. The method of claim 19, wherein determining from the time-pairs a time-pair regression line comprises:

for each time-pair, forming a time-pair relative offset by subtracting a first time offset of the time-pair from a second time offset of the time-pair;

forming a histogram of the time-pair relative offsets; and identifying a peak in the histogram, whereby the peak determines a best relative offset of the time-pair regression line.

21. The method of claim 1, wherein determining the first set of content features from the first data stream and the second set of content features from the second data stream comprises identifying peaks within a local frequency decomposition of the first data stream and the second data stream.

22. The method of claim 21, further comprising:

calculating a vector from the local frequency decomposition; and determining a feature characterized by the vector.

23. The method of claim 1, wherein a content feature is a frequency-spectral peak of a data stream.

24. A method of identifying content within a data stream comprising providing a processor for:

receiving a first data stream that includes at least a portion of a second data stream;

determining a length of the portion of the second data stream included within the first data stream;

and determining which portion of the second data stream is the portion included within the first data stream.

25. The method of claim 24, further comprising:

determining a first set of content features from the first data stream, each feature in the first set of content features occurring at a corresponding time offset in the first data stream;

determining a second set of content features from the second data stream, each feature in the second set of content features occurring at a corresponding time offset in the second data stream;

identifying features from the second set of content features that are in the first set of content features; and determining the length of the portion of the second data stream within the first data stream from corresponding time offsets of features from the second set of content features that are in the first set of content features.

26. A method of identifying content within a data stream comprising a processor for:

determining a first set of content features from a first data stream, each feature in the first set of content features occurring at a corresponding time offset in the first data stream;

determining a second set of content features from a second data stream, each feature in the second set of content features occurring at a corresponding time offset in the second data stream;

identifying features from the second set of content features that are in the first set of content features;

from the identified features, identifying a set of time-pairs, wherein a time-pair includes a time offset in the first data stream associated with a feature from the first data stream and a time offset in the second data stream associated with a feature from the second data stream that matches the feature from the first data stream; and identifying time-pairs within the set of time-pairs having a linear relationship.

27. The method of claim 26, further comprising determining a length of a portion of the second data stream that is within the first data stream.

28. The method of claim 27, wherein determining the length of the portion of the second data stream that is within the first data stream comprises:

within the set of time-pairs having the linear relationship, identifying an earliest corresponding time offset and a latest corresponding time offset; and calculating a difference between the earliest corresponding time offset and the latest corresponding time offset.

* * * * *